United States Patent
Birdsley et al.

(10) Patent No.: US 6,433,572 B1
(45) Date of Patent: Aug. 13, 2002

(54) INTERGRATED CIRCUIT INTEGRITY ANALYSIS AS A FUNCTION OF MAGNETIC FIELD DECAY

(75) Inventors: Jeffrey D. Birdsley; Michael R. Bruce; Rama R. Goruganthu; Brennan Davis; Rosalinda M. Ring, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/378,848

(22) Filed: Aug. 23, 1999

(51) Int. Cl.[7] ............................................... G01R 31/28
(52) U.S. Cl. ...................... 324/765; 324/750; 324/529; 324/240
(58) Field of Search ............................... 324/240, 226, 324/529, 239, 750, 765

(56) References Cited

U.S. PATENT DOCUMENTS

| 5,408,178 A | 4/1995 | Wikso, Jr. et al. |
| 6,064,220 A | * 5/2000 | Sugasawara et al. ........ 324/529 |

* cited by examiner

Primary Examiner—Walter E. Snow

(57) ABSTRACT

A system and method for analyzing an integrated circuit device involves generating a magnetic field in circuitry forming a power grid within the integrated circuit device. The magnetic field generator is switched off, and the charge on the power grid dissipates through internal device structures to ground. This decay of the charged power grid is detected and evaluated to assess the quality or consistency of the power distribution grid. Faulty power grids will have a decay pattern that differs from high quality power grids.

15 Claims, 3 Drawing Sheets

INTERGRATED CIRCUIT INTEGRITY ANALYSIS AS A FUNCTION OF MAGNETIC FIELD DECAY

FIELD OF THE INVENTION

The present invention relates generally to integrated circuit devices and their manufacture and, more particularly, to integrated circuit devices and their manufacture involving analysis of circuit integrity.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors operating at speeds of hundreds of millions of instructions per second to be packaged in relatively small, air-cooled semiconductor device packages. A by-product of such high-density and high functionality has been an increase in the number and complexity of the manufacturing processes, as well as an increase in the difficulty of maintaining adequate levels of quality control in such processes.

As the manufacturing processes for semiconductor devices increase in difficulty, the cost of such devices rises, and methods for analyzing the devices become increasingly important. Not only is it important to ensure that individual chips are functional, it is also important to ensure that batches of chips perform consistently. In addition, the ability to detect a defective manufacturing process early is advantageous in reducing the number of defective devices manufactured.

A particular attribute of semiconductor manufacturing involves testing the integrity of the device circuitry, such as metal interconnects, transistors, and other devices found in integrated circuits. Ensuring the integrity of such devices is important for maintaining proper circuit function, reliability, and longevity. In many applications, access to device circuitry for performing such testing is difficult, and available testing methods are often impractical or otherwise inefficient.

Due to the cost of manufacturing such devices, and o the necessity of maintaining an adequate level of device quality, the semiconductor industry would benefit from a method and apparatus for efficiently analyzing the circuitry in an integrated circuit die.

SUMMARY OF THE INVENTION

The present invention is exemplified in a number of implementations and applications, some of which are summarized below. According to an example embodiment, the present invention is directed to a method for analyzing an integrated circuit device wherein a degree of integrity of circuitry in the device is determined as a function of the decay of a magnetic field in the device.

According to another example embodiment, a method for analyzing an integrated circuit device includes using a magnetic field generator to generate a magnetic field in the integrated circuit device. The magnetic field generator is then stopped, a magnetic field imaging system is used, and the decay of the magnetic field is monitored. A degree of circuit integrity is determined via the monitored decay, e.g., by comparing decay image signatures to an expected "norm" signature.

According to yet another example embodiment, a system is configured and arranged to analyze an integrated circuit device. The system includes a magnetic field generator for generating a magnetic field into the integrated circuit device. A magnetic field imaging system for imaging the magnetic field is also included. An analyzing system is used for determining a degree of integrity of the integrated circuit via the magnetic field image generated at the magnetic field imaging system.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
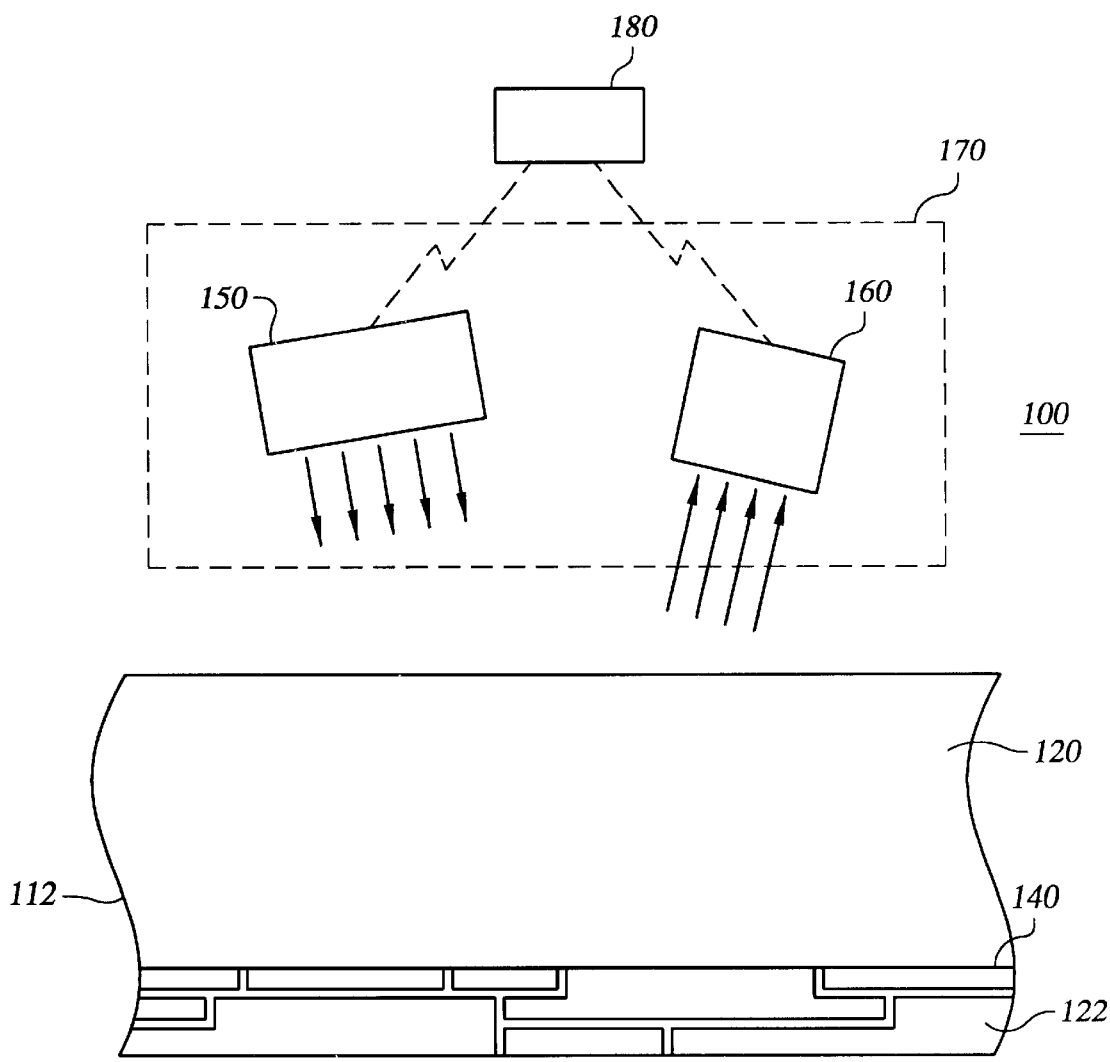
FIG. 1 shows a system for determining a degree of integrity of circuitry in an integrated circuit device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for integrated circuit devices requiring or benefiting from circuit analysis. While the present invention is not necessarily limited to such devices, various aspects of the invention may be appreciated through a discussion of various examples using this context.

In connection with the present invention, it has been discovered that the dissipation of magnetic charge in integrated circuit devices varies with the integrity of the circuitry within the device. Generally, the signature of defective circuitry tends to be different than the signature of non-defective circuitry, e.g., defective circuitry holds a magnetic charge longer than non-defective circuitry (and vice verse). This characteristic provides an innovative manner in which to analyze circuitry within integrated circuit devices. For instance, and according to an example embodiment of the present invention, the charge dissipation can be detected and used to determine a degree of circuit integrity. The determination of circuit integrity is useful in several applications including testing prior to use, analyzing defective devices, and analyzing device batches for quality and consistency.

A standard decay rate may be determined for a properly functioning integrated circuit of a particular design. By comparing the decay rates of defective devices with a specific decay signature, defective devices are identified. The specific decay signature may be modified to accommodate a desired level of quality assurance. Typical defects of concern include areas of high resistance (short of being an open) and opens in the device, and particularly those resulting in immediate failure, an immediate or future reduction in performance, and a reduction in operational life of the device. As the decay rate of additional integrated circuits having various defects is determined, the specific decay signature may be compared to more accurately depict the circuit integrity, such as for predicting the potential for long-term reliability of the integrated circuit.

The present invention may be implemented in various manners. According to an example embodiment of the present invention, a magnetic field generator is situated over an integrated circuit device and generates a magnetic field within the integrated circuit device. The magnetic field is generated in device circuitry, such as in metal interconnects that form a power grid. The generator is then turned off, and the charge on the power grid decays by dissipation through internal device structures to ground. The decay of the generated magnetic field is monitored using field imaging system. The monitored decay is analyzed, and a degree of circuit integrity is determined therefrom.

FIG. 1 shows a system 100 for analyzing an integrated circuit device 112, according to another example embodiment of the present invention. The integrated circuit device 112 has a backside 120 and circuitry near a circuit side 122. A magnetic field generator 150 is used to generate a magnetic field in the integrated circuit device 112. The magnetic field generator 150 may include devices such as devices running current through and subject circuits. A magnetic field imaging system 160 is used to image the generated magnetic field. The magnetic field imaging system may include devices such as a SQUID (Superconducting Quantum Interference Device) microscope available from Neocera. The magnetic image may then be used for analyzing the integrated circuit device 112 and determining therefrom a degree of integrity of the circuit. In addition, the functions of generating a magnetic field, imaging the magnetic field, and analyzing the magnetic image may be accomplished with a single system or device configured and arranged to perform all functions.

The system shown in FIG. 1 may also be used in connection and combination with other devices and systems. For instance, the magnetic field generator 150 and the magnetic field imaging system 160 may be combined into one system 170. In another implementation, a processor 180 is coupled to the magnetic field generator 150 and to the magnetic field imaging system 160 for controlling the system 170. The processor 180 may also be used for analyzing the image and determining a degree of integrity of the integrated circuit. Optionally, the image may be analyzed by an operator. The integrated circuit device may also be coupled to circuitry such as a ground or a test fixture, according to another implementation not shown in FIG. 1. Also not shown in FIG. 1, in still another implementation, a system adapted to remove substrate from the integrated circuit device involves one of an independent system or a system coupled to one or all of the system components shown in FIG. 1.

Figure 2:
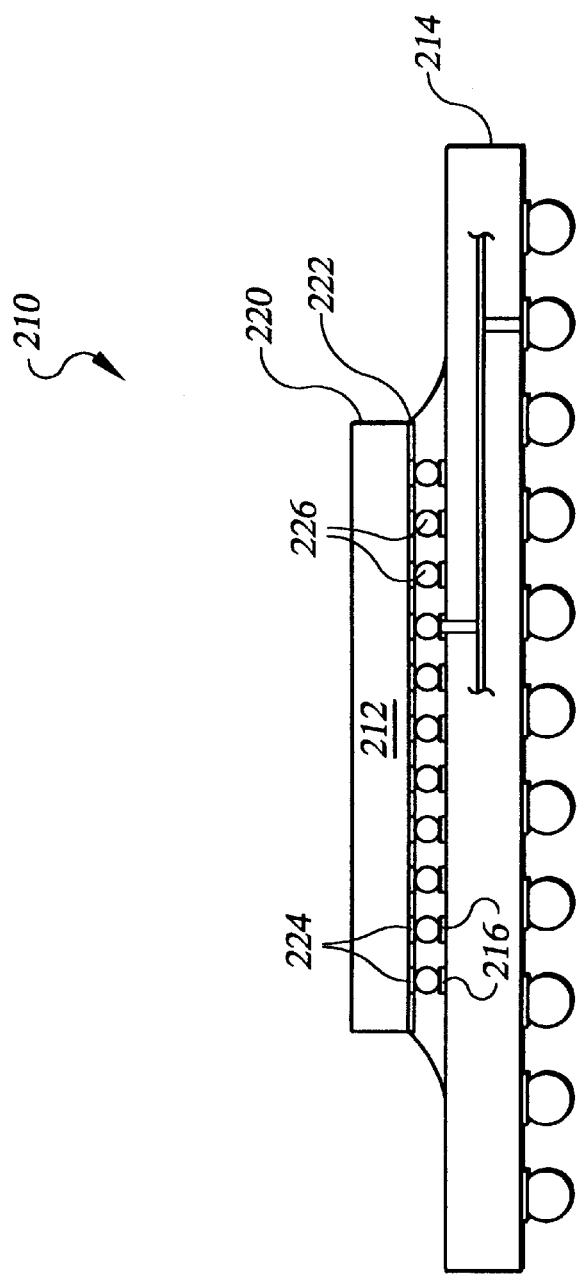
FIG. 2 shows an example integrated circuit device consistent with the present invention.

The present invention is applicable to various integrated circuit devices. For instance, FIG. 2 shows a flip-chip type integrated circuit device 212 mounted to a package 214, according to another example embodiment of the present invention. The flip-chip device 212 has a backside 220 opposite circuitry in a circuit side 222. The flip-chip 212 is coupled to the package 214 via pads 224 and 216 and connections 226. The orientation of the flip-chip 212 with the circuit side face down on the package 214 prevents easy access to circuitry in the circuit side 222. The present invention is particularly useful for analyzing such a flip-chip because it does not necessarily require direct access to the circuit side 222. A magnetic field maybe generated in the flip-chip 212 via the backside 220 and, upon stopping the generation of the magnetic field, the decay of a resulting magnetic charge in the circuitry can be measured. In addition, and according to another example embodiment, the backside 220 may be thinned prior to generating a magnetic field in the flip-chip 212. Thinning the backside 220 may include exposing substrate for analysis, and may include silicon substrate, circuitry, or devices in the flip-chip.

Figure 3:
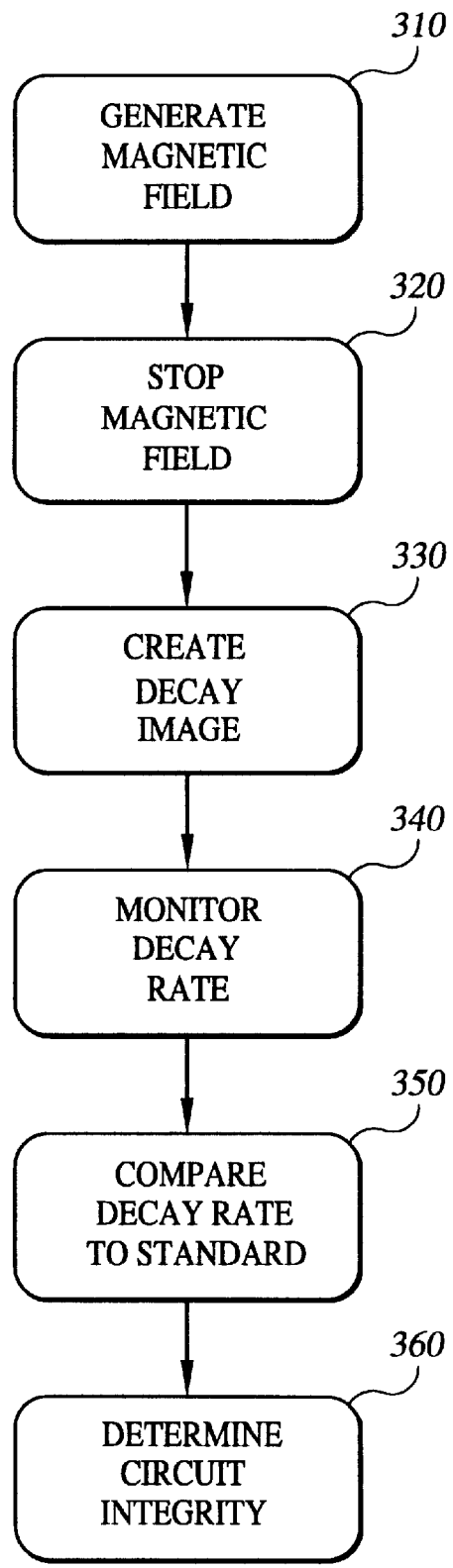
FIG. 3 is a flow diagram for a method of analyzing an integrated circuit device, according to another example embodiment of the present invention.

FIG. 3 shows a flowchart for a method of analyzing an integrated circuit device, according to another example embodiment of the present invention. A magnetic field generator is used to generate a magnetic field in an integrated circuit at block 310. The magnetic field generator is then stopped at 320, and a decay image of the magnetic field is created at block 330. The decay rate is then monitored at block 340 via the image obtained at block 330, and is compared to a standard decay rate at block 350. Via the comparison, a degree of circuit integrity is determined at block 360. For example, the comparison at block 350 may be accomplished by an operator viewing the image or by a processor that compares the image to a standard.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing an integrated circuit device comprising:

detecting a decay signature of a magnetic field in the integrated circuit device; and determining a degree of integrity of the integrated circuit device as a function of the detected decay signature.

2. A method for analyzing an integrated circuit device comprising:

using a magnetic field generator and generating a magnetic field in the integrated circuit device;

stopping the magnetic field generator; and using a magnetic field imaging system, monitoring the decay of the magnetic field, and determining therefrom a degree of circuit integrity.

3. A method for analyzing an integrated circuit device, according to claim 2, wherein the magnetic field imaging system includes a SQUID imaging device.

4. A method for analyzing an integrated circuit device, according to claim 2, further comprising comparing the decay signature to a standard decay signature for a non-defective device.

5. A method for analyzing an integrated circuit device, according to claim 2, wherein the circuitry within the device includes a power distribution grid, and wherein generating a magnetic field includes charging the power grid.

6. A method for analyzing an integrated circuit device, according to claim 5, wherein a defective power distribution grid holds the charge for a period of time that is measurably different than for a non-defective grid.

7. A method for analyzing an integrated circuit device, according to claim 2, further comprising removing substrate from the integrated circuit device.

8. A method for analyzing an integrated circuit device, according to claim 2, further comprising coupling the integrated circuit device to a ground.

9. A method for analyzing an integrated circuit device, according to claim 2, further comprising coupling the integrated circuit device to a test fixture.

10. A method for analyzing an integrated circuit device, according to claim 2, wherein the integrated circuit device includes a flip-chip type die having a circuit side and a back side, and circuitry near the circuit side.

11. A method for analyzing an integrated circuit device, according to claim 10, further comprising removing substrate from the back side of the die.

12. A method for analyzing an integrated circuit device, according to claim 11, wherein removing substrate from the back side of the die includes exposing circuitry within the die.

13. A method for analyzing an integrated circuit device, comprising:

detecting a decay signature of a magnetic field in the integrated circuit device; and determining a degree of integrity of the integrated circuit device as a function of the detected decay signature on metal power interconnects within the integrated circuit device.

14. A method for analyzing an integrated circuit device, according to claim 13, wherein monitoring the decay of the magnetic field includes monitoring metal power interconnects within the integrated circuit device.

15. A method for analyzing an integrated circuit device, according to claim 2, wherein monitoring the decay of the magnetic field includes monitoring decay on metal power interconnects within the integrated circuit device.

* * * * *

UNITED STATES PATENT AND TRADEMARK OFFICE
CERTIFICATE OF CORRECTION

PATENT NO. : 6,433,572 B1
DATED : August 13, 2002
INVENTOR(S) : Birdsley et al.

It is certified that error appears in the above-identified patent and that said Letters Patent is hereby corrected as shown below:

Column 1,
Line 44, "and o the" should read -- and to the --.

Column 2,
Line 25, after "device" please insert -- , --.

Column 3,
Line 23, "using field" should read -- using a magnetic field --.

Column 4,
Line 8, "maybe" should read -- may be --.

Signed and Sealed this

Thirty-first Day of December, 2002

JAMES E. ROGAN
*Director of the United States Patent and Trademark Office*